(12) United States Patent
Seo

(10) Patent No.: US 11,211,586 B2
(45) Date of Patent: Dec. 28, 2021

(54) FLEXIBLE DISPLAY DEVICE INCLUDING WINDOW SUBSTRATE, AND MANUFACTURING METHOD THEREOF

(71) Applicant: SAMSUNG DISPLAY CO., LTD., Yongin-si (KR)

(72) Inventor: Taean Seo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/704,724

(22) Filed: Dec. 5, 2019

(65) Prior Publication Data

US 2020/0227678 A1 Jul. 16, 2020

(30) Foreign Application Priority Data

Jan. 15, 2019 (KR) .................. 10-2019-0005383

(51) Int. Cl.
| | | |
|---|---|---|
| *H01L 51/52* | (2006.01) | |
| *H01L 27/32* | (2006.01) | |
| *H01L 51/00* | (2006.01) | |
| *H01L 51/56* | (2006.01) | |

(52) U.S. Cl.
CPC ...... *H01L 51/5253* (2013.01); *H01L 27/3244* (2013.01); *H01L 51/0097* (2013.01); *H01L 51/56* (2013.01)

(58) Field of Classification Search
CPC ............ H01L 51/5253; H01L 27/3244; H01L 51/0097; H01L 51/56; H01L 2251/5338; Y02E 10/549; G02B 1/14; G06F 1/1652; H04M 1/185; H04M 1/0268; G09F 9/301; G09F 9/33

USPC ........................................................... 257/72
See application file for complete search history.

(56) References Cited

U.S. PATENT DOCUMENTS

| | | | |
|---|---|---|---|
| 9,809,012 B2 | 11/2017 | Xie | |
| 9,947,727 B2 * | 4/2018 | Lee | ........ G06F 3/0446 |
| 2001/0043172 A1 * | 11/2001 | McGrath | .......... G09G 3/22 |
| | | | 345/75.2 |
| 2016/0135286 A1 | 5/2016 | Hwang et al. | |
| 2016/0224068 A1 | 8/2016 | Choi et al. | |
| 2016/0303843 A1 | 10/2016 | Jang et al. | |
| 2017/0069879 A1 | 3/2017 | Um | |
| 2017/0194580 A1 * | 7/2017 | Lee | ............ H01L 51/5256 |
| 2019/0061173 A1 * | 2/2019 | Cui | .............. B25J 15/0616 |

FOREIGN PATENT DOCUMENTS

| | | |
|---|---|---|
| KR | 10-2013-0045749 | 5/2013 |
| KR | 10-1480267 | 12/2014 |
| KR | 10-2016-0111597 | 9/2016 |
| KR | 10-2017-0029707 | 3/2017 |
| KR | 10-2018-0000822 | 1/2018 |

OTHER PUBLICATIONS

European Search Report dated May 13, 2020 in Corresponding European Patent Application No. 20151569.9.

\* cited by examiner

*Primary Examiner* — Vu A Vu
(74) *Attorney, Agent, or Firm* — F. Chau & Associates, LLC

(57) ABSTRACT

A flexible display device includes a base substrate, a display panel disposed on the base substrate, and a first protective film disposed on one surface of the base substrate. The display panel includes a plurality of pixels and a plurality of signal lines connected to the plurality of pixels. The first protective film has one or more vacuum holes.

16 Claims, 10 Drawing Sheets

FLEXIBLE DISPLAY DEVICE INCLUDING WINDOW SUBSTRATE, AND MANUFACTURING METHOD THEREOF

CROSS-REFERENCE TO RELATED APPLICATIONS

This application claims priority under 35 U.S.C. § 119 to Korean Patent Application No. 10-2019-0005383, filed on Jan. 15, 2019 in the Korean Intellectual Property Office (KIPO), the disclosure of which is incorporated by reference herein in its entirety.

TECHNICAL FIELD

Exemplary embodiments of the present invention relate to a flexible display device including a window substrate, and a method of manufacturing the flexible display device including the window substrate. More particularly, exemplary embodiments of the present invention relate to a flexible display device including a window substrate capable of substantially preventing delamination of a window and a protective film in a manufacturing process by using a vacuum hole defined in the protective film of the window, and a method of manufacturing the flexible display device.

DISCUSSION OF THE RELATED ART

In general, plastic windows having flexibility are used for flexible display devices capable of being bended, folded, or rolled.

However, since plastic windows have a low hardness, scratches, dents, flaws, etc., may occur when a touch is performed by applying a force on the window using a finger or a pen.

Accordingly, plastic windows may include an anti-finger layer so that scratches, dents, etc. are prevented. In addition, a protective film may be laminated on the anti-finger layer in the window.

An adhesive, a display panel, and a polarizing plate, for example, may be laminated (e.g., attached) to the window. In such a laminating process, the use of rollers may cause defects. For example, the use of rollers may introduce foreign substances and create static electricity, and such foreign substances may adhere to the protective film.

In such a case, an attachment force between the window and the protective film may be weak due to the anti-finger layer. As a result, the protective film may be easily delaminated from the window.

SUMMARY

Exemplary embodiments of the present invention may be directed to a window substrate capable of substantially preventing delamination between a window and a protective film by using a vacuum hole defined in the protective film of the window, thus maintaining a lamination state between the window and the protective film in a manufacturing process, to a flexible display device including the window substrate, and to a method of manufacturing the flexible display device.

According to an exemplary embodiment of the present invention, a flexible display device includes a base substrate, a display panel, and a first protective film. The display panel is disposed on the base substrate, and includes a plurality of pixels and a plurality of signal lines connected to the plurality of pixels. The first protective film is disposed on one surface of the base substrate and has one or more vacuum holes.

In an exemplary embodiment, one of the one or more vacuum holes overlaps a vacuum inlet formed in a stage on which the base substrate is disposed during a manufacturing process.

In an exemplary embodiment, the one of the one or more vacuum holes has a size larger than a size of the vacuum inlet of the stage.

In an exemplary embodiment, the one or more vacuum holes has a shape of a circle, a polygon, or a combination thereof.

In an exemplary embodiment, the flexible display device further includes an adhesive layer disposed between the one surface of the base substrate and the first protective film.

In an exemplary embodiment, the flexible display device further includes an anti-finger layer disposed on the one surface of the base substrate. The first protective film is disposed on the anti-finger layer.

In an exemplary embodiment, the one or more vacuum holes are defined in the first protective film at substantially regular intervals.

In an exemplary embodiment, the one or more vacuum holes are uniformly distributed in the first protective film, and each vacuum hole has a predetermined size.

In an exemplary embodiment, the one or more vacuum holes are arranged at substantially regular intervals along an edge of the base substrate in a plan view.

In an exemplary embodiment, the base substrate is one of a glass substrate, a polyimide (PI) substrate, and a plastic substrate.

According to an exemplary embodiment of the present invention, a flexible display device includes a base substrate, a first protective film disposed on one surface of the base substrate and having one or more vacuum holes, a first adhesive layer disposed on another surface of the base substrate, a display panel disposed on the first adhesive layer, a second adhesive layer disposed on the display panel, and a second protective film disposed on the second adhesive layer.

In an exemplary embodiment, the one or more vacuum holes are defined in an area of the first protective film corresponding to a non-display area of the display panel.

In an exemplary embodiment, the one or more vacuum holes are uniformly distributed in the first protective film, and each vacuum hole has a diameter less than a diameter of a vacuum inlet formed in a stage on which the base substrate is disposed during a manufacturing process.

In an exemplary embodiment, the first protective film has a release force with respect to the base substrate, which is about equal to or greater than about 20 gf/inch by a suction force from the vacuum inlet through the one or more vacuum holes.

In an exemplary embodiment, the base substrate has a release force greater than a release force of the first adhesive layer due to the one or more vacuum holes of the first protective film.

In an exemplary embodiment, the vacuum holes are dispersed over an area of the first protective film corresponding to a display area and a non-display area of the display panel.

According to an exemplary embodiment of the present invention, a method of manufacturing a flexible display device includes (a) disposing a first protective film on one surface of a base substrate, the first protective film having one or more vacuum holes, (b) disposing another surface of the first protective film on a stage having one or more vacuum inlets, and (c) adsorbing the base substrate and the first protective film to the stage through vacuum suction applied via the one or more vacuum holes and the one or more vacuum inlets.

In an exemplary embodiment, the method further comprises (d) laminating one surface of a first adhesive layer to another surface of the base substrate, (e) laminating one surface of a display panel to another surface of the first adhesive layer, (f) laminating one surface of a second adhesive layer to another surface of the display panel, and (g) laminating a second protective film to another surface of the second adhesive layer.

In an exemplary embodiment, in (c) adsorbing the base substrate and the first protective film to the stage, the base substrate is adsorbed to the stage through the vacuum suction applied via the one or more vacuum holes defined in an area of the first protective film corresponding to a non-display area of the display panel.

In an exemplary embodiment, in (c) adsorbing the base substrate and the first protective film to the stage, the base substrate is adsorbed to the stage through the vacuum suction applied via the one or more vacuum holes defined in an area of the first protective film corresponding to a display area of the display panel.

In an exemplary embodiment, (a) disposing the first protective film on one surface of the base substrate includes (a-1) applying an anti-finger layer to the one surface of the base substrate, and (a-2) disposing the first protective film on the anti-finger layer.

In an exemplary embodiment, in (c) adsorbing the base substrate and the first protective film to the stage, the first protective film has a release force greater than a release force of the second protective film by a vacuum suction force from the stage through the one or more vacuum inlets.

In an exemplary embodiment, in (c) adsorbing the base substrate and the first protective film to the stage, the first protective film has a release force with respect to the base substrate, which is about equal to or greater than about 20 gf/inch by a vacuum suction force from the stage through the one or more vacuum inlets and the one or more vacuum holes.

In an exemplary embodiment, in (c) adsorbing the base substrate and the first protective film to the stage, the one or more vacuum holes of the first protective film are defined each in a shape having a diameter less than a diameter of one of the one or more vacuum inlets formed in the stage, and are uniformly distributed in the first protective film.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION

Figure 1:
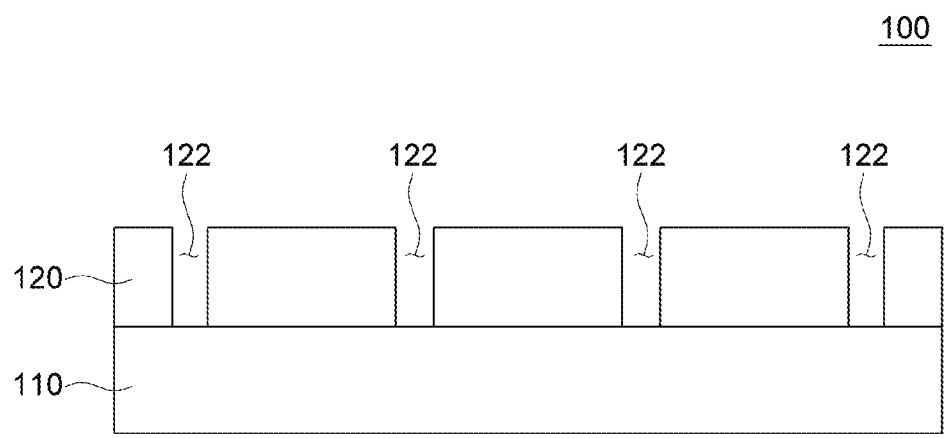
FIG. 1 is a view illustrating a configuration of a window substrate for a flexible display device according to an exemplary embodiment.

Exemplary embodiments of the present invention will be described more fully hereinafter with reference to the accompanying drawings. Like reference numerals may refer to like elements throughout the accompanying drawings.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. When a layer, area, or plate is referred to as being "below" another layer, area, or plate, it may be directly below the other layer, area, or plate, or intervening layers, areas, or plates may be present therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case in which a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Hereinafter, a window substrate according to an exemplary embodiment, a flexible display device including the window substrate, and a method of manufacturing the flexible display device will be described with reference to FIGS. 1 to 12.

FIG. 1 is a view illustrating a configuration of a window substrate for a flexible display device according to an exemplary embodiment.

Referring to FIG. 1, a window substrate 100 according to an exemplary embodiment includes a base substrate 110, and a first protective film 120 disposed on one surface of the base substrate 110. The first protective film 120 includes one or more vacuum holes 122.

The base substrate 110 may be, for example, one of a glass substrate, a polyimide (PI) substrate, and a plastic substrate. In the following description, a glass substrate is selected as the base substrate 110 according to an exemplary embodiment by way of example, and the glass substrate 110 will be described as the base substrate 110. However, the base substrate 110 is not limited thereto. Herein, the terms base substrate 110 and glass substrate 110 may be used interchangeably.

The glass substrate 110 may include a transparent material such as, for example, glass or resin. The glass substrate 110 may be laminated (e.g., attached or bonded) to the display panel and may serve to protect the display panel. For example, the glass substrate 110 may protect the display panel from being broken by an external impact.

As used herein, the singular forms "a", "an" and "the" are intended to include the plural forms as well, unless the context clearly indicates otherwise. Further, as used herein, "lamination" means attachment or joining of thin films.

Figure 2:
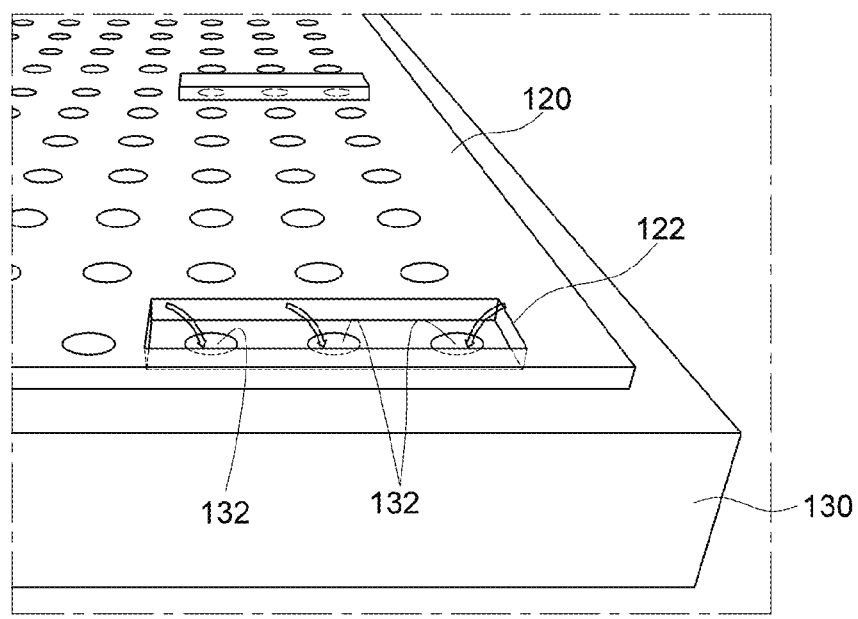
FIG. 2 is a view illustrating an exemplary embodiment in which vacuum holes overlapping vacuum inlets of a stage are defined on a protective film.

FIG. 2 is a view illustrating an exemplary embodiment in which vacuum holes overlapping vacuum inlets of a stage are defined on a protective film.

Referring to FIG. 2, the vacuum hole 122 may overlap a vacuum inlet 132 formed in a stage 130 that adsorbs the first protective film 120. The glass substrate 110 may be disposed on the stage 130 during a manufacturing process. In FIG. 2, the stage 130 adsorbs the first protective film 120 laminated to the glass substrate 110 by a suction force. For example, a suction force may be created by sucking air through the plurality of vacuum inlets 132. In such an exemplary embodiment, since the vacuum holes 122 are defined in the first protective film 120, the stage 130 adsorbs the first protective film 120 as a result of the air suction force through the vacuum inlet 132 overlapping the vacuum hole 122.

The vacuum hole 122 may have a size larger than a size of the vacuum inlet 132 of the stage 130. In an exemplary embodiment, the vacuum holes 122 may have about the same size as each other, the vacuum inlets 132 may have about the same size as each other, and each of the vacuum holes 122 may have a size larger than a size of each of the vacuum inlets 132. Each of the vacuum holes 122 may have a shape of, for example, one of a circle and a polygon, or a combination thereof. For example, each of the vacuum holes 122 may have a quadrangular shape that overlaps three vacuum inlets 132, as illustrated in FIG. 2. That is, in an exemplary embodiment, each vacuum hole 122 may overlap three vacuum inlets 132. However, the present invention is not limited thereto. For example, in exemplary embodiments, each vacuum hole 122 may overlap two vacuum inlets 132 or four or more vacuum inlets 132, or the vacuum holes 122 and the vacuum inlets 132 may be disposed in a one-to-one correspondence (e.g., each vacuum hole 122 may overlap one vacuum inlet 132).

Figure 3:
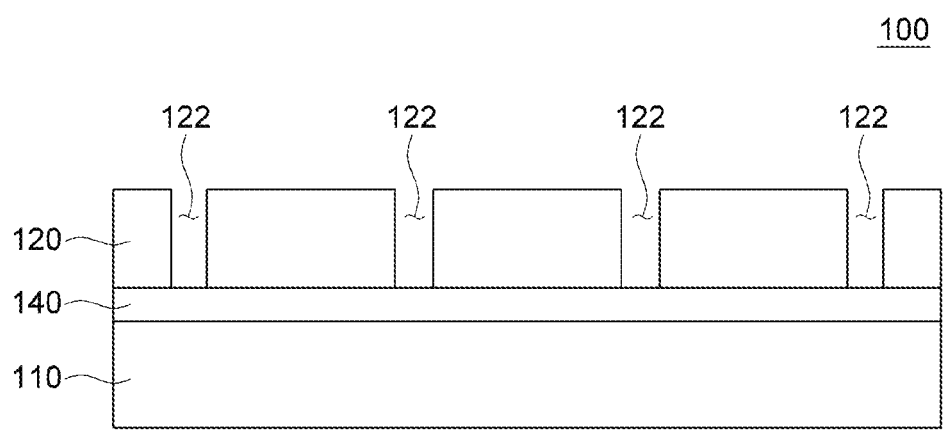
FIG. 3 is a view illustrating an exemplary embodiment in which an adhesive layer is disposed between a protective film and a glass substrate.
Figure 4:
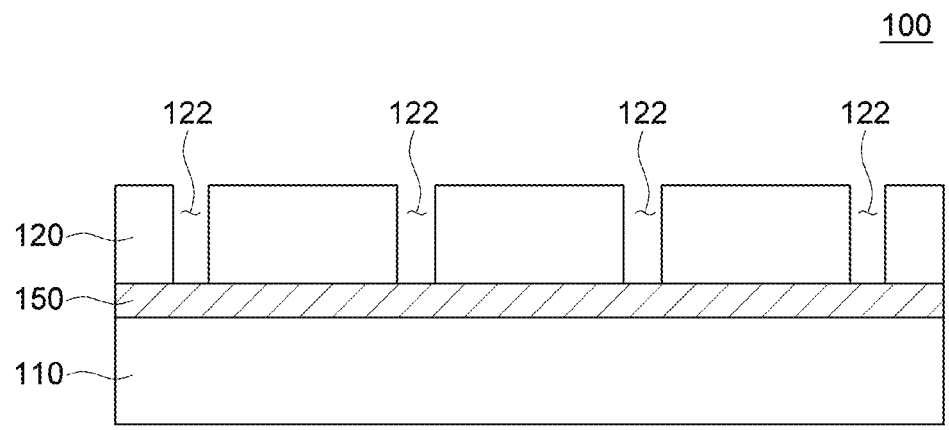
FIG. 4 is a view illustrating an exemplary embodiment in which an anti-finger layer is disposed between a protective film and a glass substrate.

FIG. 3 is a view illustrating an exemplary embodiment in which an adhesive layer is disposed between a protective film and a glass substrate. FIG. 4 is a view illustrating an exemplary embodiment in which an anti-finger layer is disposed between a protective film and a glass substrate.

Referring to FIG. 3, the window substrate 100 may further include an adhesive layer 140 disposed between one surface of the glass substrate 110 and the first protective film 120. In such an exemplary embodiment, an optically clear adhesive (OCA) may be used as the adhesive of the adhesive layer 140.

Referring to FIG. 4, an anti-finger layer 150 may be applied on at least one surface of the glass substrate 110. For example, the first protective film 120 may be disposed on the anti-finger layer 150, which may be disposed on the glass substrate 110.

The anti-finger layer 150 serves to protect the glass substrate 110 from being scratched or pressed, and may include, for example, a shape memory polymer (SMP) layer. The anti-finger layer 150 may include, for example, at least one of a fluorine-based material and a carbon-based material. However, the anti-finger layer 150 is not limited thereto. Herein, the terms anti-finger layer 150 and SMP layer may be used interchangeably.

The SMP is a material that maintains a certain shape under certain conditions of stimulation such as, for example, temperature and electric field. For example, the SMP may maintain its intended shape even in the presence of temperature fluctuations. Even though such an SMP may be deformed by external impact, the SMP has characteristics causing it to return to its original shape when specific conditions are met.

In such an exemplary embodiment, the SMP layer may include a transparent material so as not to affect the visibility of the glass substrate 110. Further, the SMP layer may include a flexible material, and the shape thereof may be restored when an electric signal is applied. For example, the SMP layer may include a flexible material allowing for the manufacture of flexible display devices, and may include a polymer material that maintains, for example, a flat shape under the condition that an electric signal is applied. Accordingly, in an exemplary embodiment, the shape of the SMP layer may be deformed under the condition that no electric signal is applied, and may be restored to the flat shape when an electric signal is applied.

Figure 5:
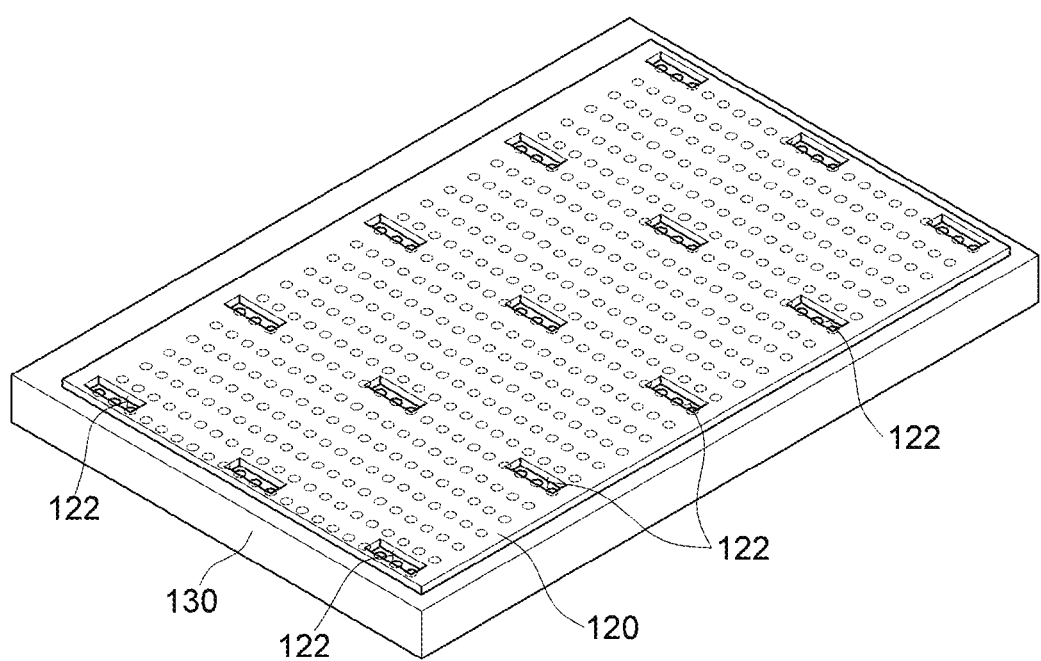
FIG. 5 is a view illustrating an exemplary embodiment in which vacuum holes are defined in a protective film at substantially regular intervals.

FIG. 5 is a view illustrating an exemplary embodiment in which vacuum holes are defined in a protective film at substantially regular intervals.

Referring to FIG. 5, the vacuum holes 122 may each have a quadrangular shape of a predetermined size, and may be defined in the first protective film 120 at substantially regular intervals. For example, the plurality of vacuum holes 122 may be defined at substantially regular intervals over an entire area of the first protective film 120, as shown in FIG. 5. Although FIG. 5 illustrates an exemplary embodiment in which the vacuum holes 122 defined at substantially regular intervals over the entire area of the first protective film 120 have a quadrangular shape and overlap a plurality of vacuum inlets 132, the present invention is not limited thereto. For example, in an exemplary embodiment, vacuum holes 122 having a shape other than a quadrangular shape may be disposed at substantially regular intervals over the entire area of the first protective film 120. In addition, in an exemplary embodiment, vacuum holes 122 may be disposed at substantially regular intervals over the entire area of the first protective film 120 and may be disposed in a one-to-one correspondence with the vacuum inlets 132, or may overlap a different number of vacuum inlets 132 than shown in FIG. 5.

Figure 6:
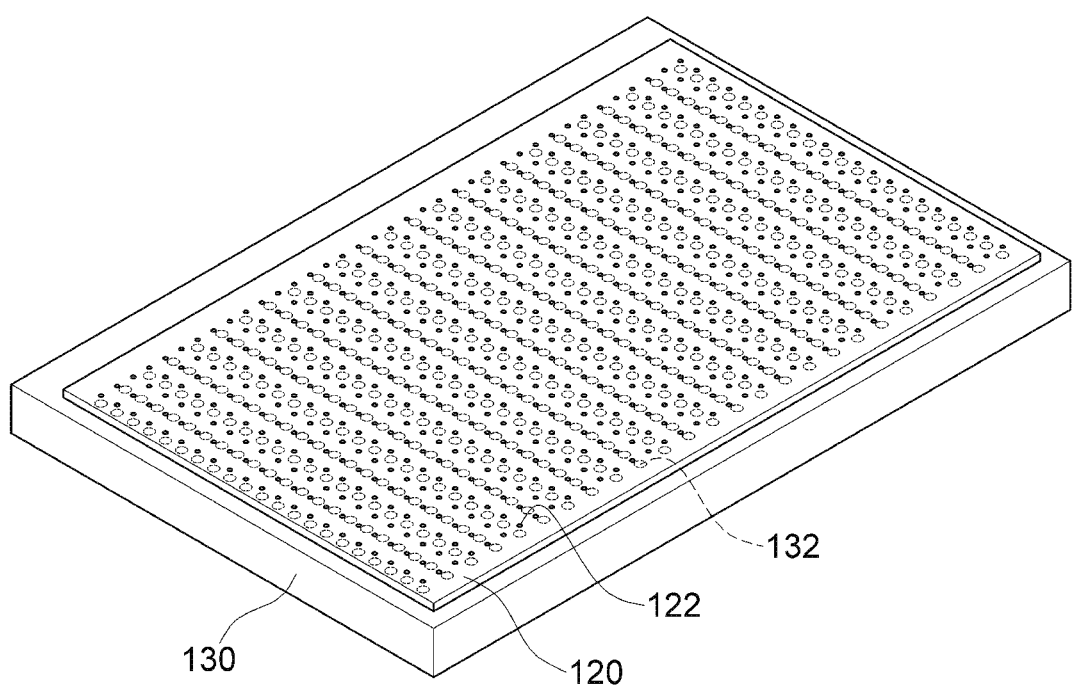
FIG. 6 is a view illustrating an exemplary embodiment in which vacuum holes are dispersed substantially equally across a protective film.

FIG. 6 is a view illustrating an exemplary embodiment in which vacuum holes are dispersed substantially equally across a protective film.

Referring to FIG. 6, the vacuum holes 122 may be dispersed substantially equally across the first protective film 120. For example, the distance between the vacuum holes 122 may be uniform across the first protective film 120 (e.g., the distance between adjacent vacuum holes 122 may be the same across the first protective film 120). That is, the vacuum holes 122 may be uniformly distributed in the first protective film 120. In FIG. 6, each of the vacuum holes 122 has a cylindrical shape having a diameter less than a diameter of the vacuum inlet 132, and the vacuum holes 122 are dispersed in a one-to-one correspondence with the vacuum inlets 132. However, the present invention is not limited thereto. For example, the number of the vacuum holes 122 which are dispersed substantially equally may be greater than the number of the vacuum inlets 132. In addition, in an exemplary embodiment, the vacuum holes 122 may be dispersed substantially equally across the first protective film 120 as shown in FIG. 6, but may have a shape other than the cylindrical shape shown in FIG. 6.

Figure 7:
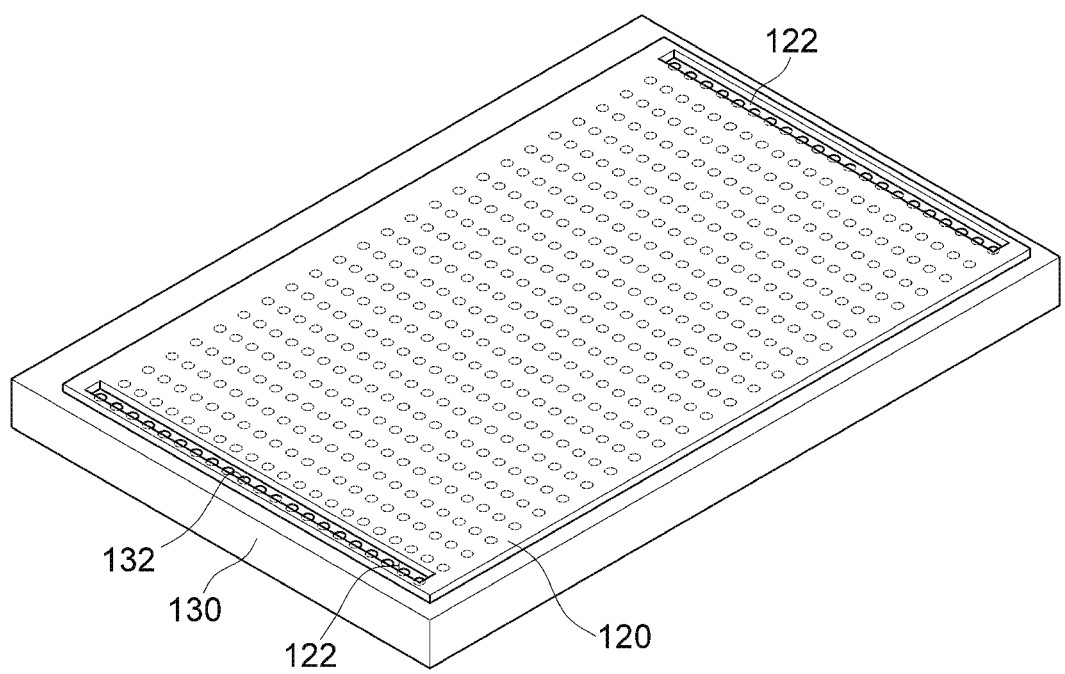
FIG. 7 is a view illustrating an exemplary embodiment in which vacuum holes are defined at an edge of a protective film.

FIG. 7 is a view illustrating an exemplary embodiment in which vacuum holes are defined at an edge of a protective film.

Referring to FIG. 7, the vacuum holes 122 may be defined at an edge of the first protective film 120 in a plan view. As illustrated in FIG. 7, the plurality of vacuum holes 122, each having a predetermined size, may be defined along an edge of the first protective film 120 so as to overlap the plurality of vacuum inlets 132 disposed at the edge of the stage 130. In addition, the plurality of vacuum holes 122 may be arranged at substantially regular intervals at a portion of the first protective film 120 corresponding to an edge of the glass substrate 110.

In such an exemplary embodiment, the edge of the first protective film 120 at which the vacuum holes 122 are defined may be a portion corresponding to a non-display area of the display panel when the window substrate 100 is laminated to the display panel. In addition, the edge of the glass substrate 110 may be a portion corresponding to the non-display area of the display panel, when the window substrate 100 is laminated to the display panel. For example, the edge of the first protective film 120 and the edge of the glass substrate 110 corresponding to the location at which the vacuum holes 122 are defined may correspond to a bezel area of the display panel.

Although FIG. 7 illustrates that the vacuum holes 122 are defined at two edges of the first protective film 120 in a plan view, the present invention is not limited thereto. For example, in an exemplary embodiment, the vacuum holes 122 may be disposed on one edge of the first protective film 120, or on three or more edges of the first protective film 120. Further, although FIG. 7 illustrates that the vacuum holes 122 are defined at edges corresponding to the short sides of the display panel, the present invention is not limited thereto. For example, the vacuum holes 122 may be defined at edges corresponding to the long sides of the display panel.

Figure 8:
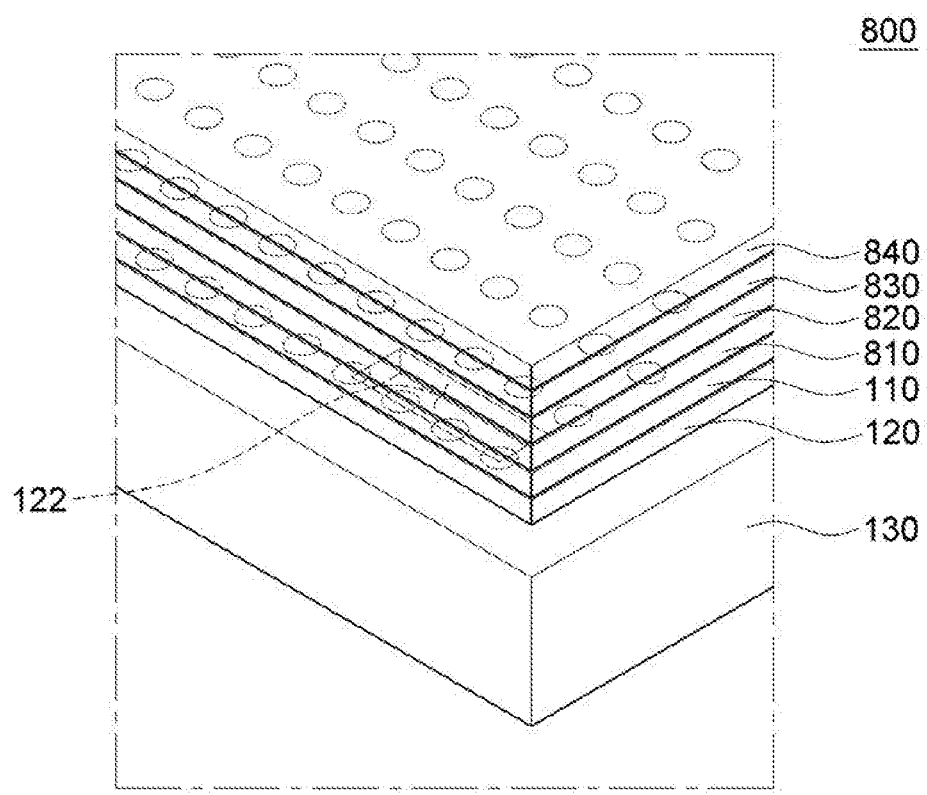
FIG. 8 is a view illustrating a configuration of a flexible display device to which a window substrate according to an exemplary embodiment is applied.

FIG. 8 is a view illustrating a configuration of a flexible display device to which a window substrate according to an exemplary embodiment is applied.

Referring to FIG. 8, a flexible display device 800 according to an exemplary embodiment includes a base substrate 110, a first protective film 120, a first adhesive layer 810, a display panel 820, a second adhesive layer 830, and a second protective film 840.

The base substrate 110 may include, for example, one of a glass substrate, a polyimide (PI) substrate, and a plastic substrate, as described with reference to FIG. 1. Although the base substrate 110 will be described as being a glass substrate 110 in the exemplary embodiment described herein, it is to be understood that the base substrate 110 is not limited thereto.

The glass substrate 110 includes a transparent material, and serves to protect the display panel 820. For example, the glass substrate 110 may protect the display panel 820 from being broken by an external impact.

As described above with reference to FIG. 1, the first protective film 120 is disposed on one surface of the glass substrate 110 and has one or more vacuum holes 122.

The first adhesive layer 810 is disposed on another surface of the glass substrate 110. For example, the first adhesive layer 810 is disposed between the glass substrate 110 and the display panel 820, thus, attaching the glass substrate 110 and the display panel 820 to each other. To this end, the first adhesive layer 810 is disposed at another surface of the glass substrate 110, which is different from a surface of the glass substrate 110 to which the first protective film 120 is attached. For example, one surface of the glass substrate 110 may be attached to the first protective film 120, and the first adhesive layer 810 may be disposed at another surface of the glass substrate 110 that opposes the one surface.

The display panel 820 is disposed on the first adhesive layer 810. For example, the display panel 820 is attached to another surface of the first adhesive layer 810 that is different from a surface of the first adhesive layer 810 that is attached to another surface of the glass substrate 110.

The second adhesive layer 830 is disposed on the display panel 820. For example, the second adhesive layer 830 is disposed on another surface of the display panel 820 that is different from a surface of the display panel 820 that is attached to another surface of the first adhesive layer 810.

The second protective film 840 is disposed on the second adhesive layer 830. For example, the second protective film 840 is attached to another surface of the second adhesive layer 830 that is different from a surface of the second adhesive layer 830 that is attached to the display panel 820.

Figure 9:
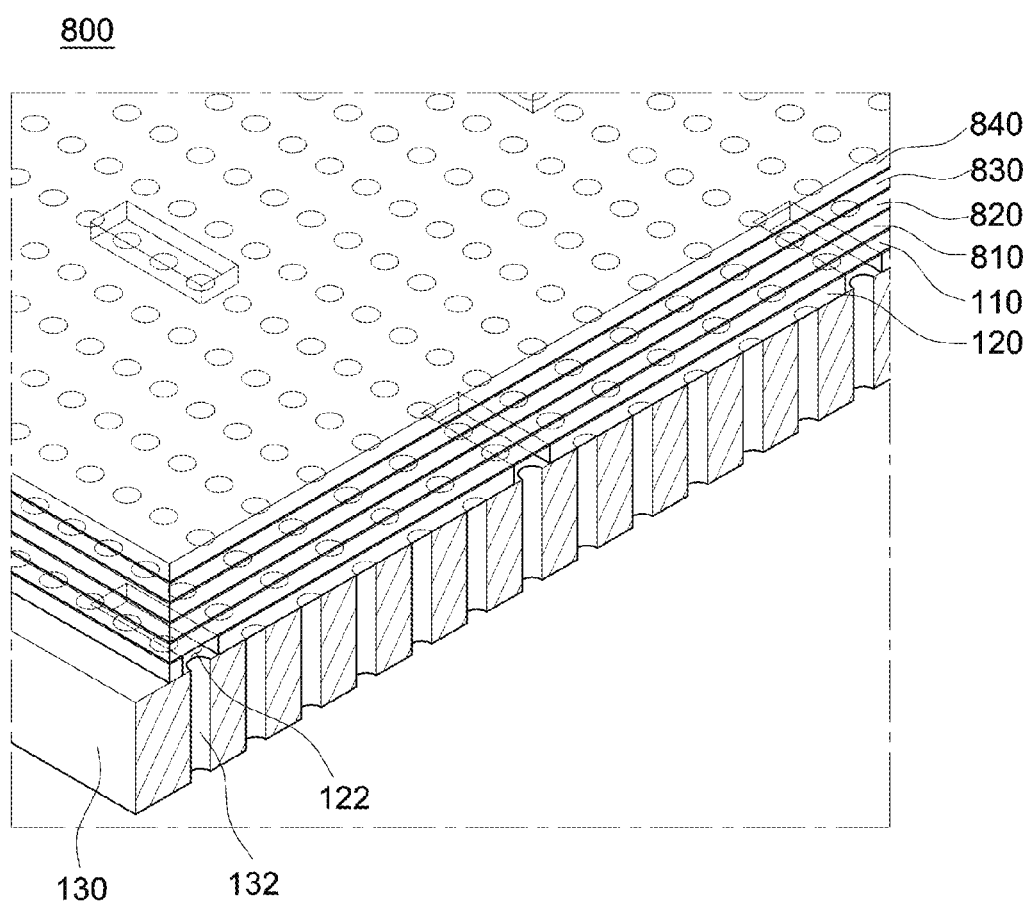
FIG. 9 is a view illustrating an exemplary embodiment in which vacuum holes are dispersed over an entire area of a first protective film corresponding to a display area and a non-display area of a display panel.

FIG. 9 is a view illustrating an exemplary embodiment in which vacuum holes are dispersed over an entire area of a first protective film corresponding to a display area and a non-display area of a display panel.

Referring to FIG. 9, the vacuum holes 122 may be dispersed over an entire area of the first protective film 120 corresponding to a display area and a non-display area of the display panel 820. For example, the vacuum holes 122 may be dispersed at substantially regular intervals over an entire area of the first protective film 120 corresponding to the display area and the non-display area of the display panel 820. That is, the vacuum holes 122 may be disposed in both the display area and the non-display area of the display panel 820. In such an exemplary embodiment, the plurality of vacuum holes 122 defined at the first protective film 120 at substantially regular intervals may be defined so as to overlap the plurality of vacuum inlets 132 of the stage 130.

The vacuum holes 122 may be defined at an area of the first protective film 120 corresponding to the non-display area of the display panel 820. That is, the vacuum holes 122 may be arranged lengthwise at each edge portion of an upper side and a lower side, along a side of the edge, corresponding to the non-display area of the display panel 820. In such an exemplary embodiment, the plurality of vacuum holes 122 arranged lengthwise along a side of the edge of the first protective film 120 may be defined so as to overlap the plurality of vacuum inlets 132 arranged at the stage 130 at substantially regular intervals.

The vacuum holes 122 may each have a shape having a diameter less than a diameter of each of the vacuum inlets 132 formed at the stage 130 of the glass substrate 110, and may be defined substantially equally at the first protective film 120. In such an exemplary embodiment, the glass substrate 110 is adsorbed to the stage 130 by an air suction force from the stage 130 through the vacuum inlet 132. The first protective film 120 laminated to the glass substrate 110 is adsorbed to the stage 130 by an air suction force through the plurality of vacuum holes 122 together with the vacuum inlets 132 of the stage 130.

Figure 10:
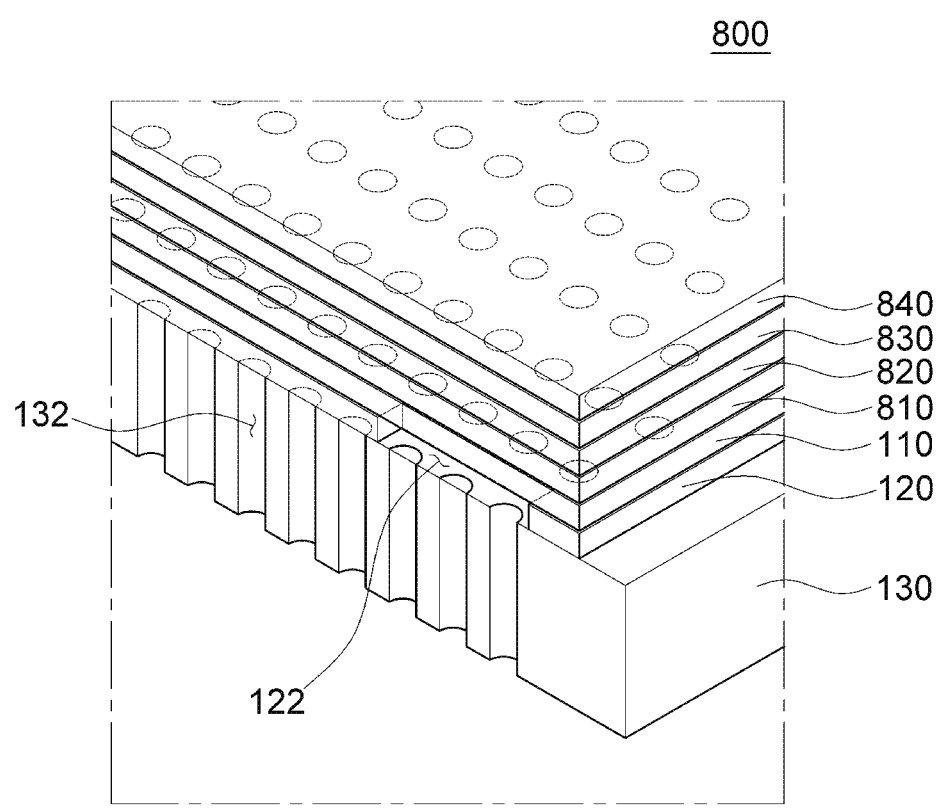
FIG. 10 is a view illustrating an exemplary embodiment in which a glass substrate has a release force through vacuum holes of a protective film.

FIG. 10 is a view illustrating an exemplary embodiment in which a glass substrate has a release force through vacuum holes of a protective film.

Referring to FIG. 10, the first protective film 120 may have a release force with respect to the glass substrate 110, which is substantially equal to or greater than about 20 gf/inch due to the suction force from the stage 130 through the vacuum inlet 132 and the vacuum hole 122. As illustrated in FIG. 10, the glass substrate 110 may have a release force greater than a release force of the first adhesive layer 810 due to the vacuum hole 122 of the first protective film 120. In such an exemplary embodiment, the release force of the first adhesive layer 810 may be substantially equal to or greater than about 15 gf/inch. The release force arising from the lamination of the glass substrate 110 with the first protective film 120 may be substantially equal to or greater than about 6 gf/inch in a case in which the air suction force is not provided from the stage 130 through the vacuum inlet 132.

Even if bubbles are generated between the glass substrate 110 and the first protective film 120 when the glass substrate 110 and the first protective film 120 are laminated to each other, the generated bubbles may be removed by the air suction force through the vacuum inlet 132 of the stage 130 and the plurality of vacuum holes 122.

Figure 11:
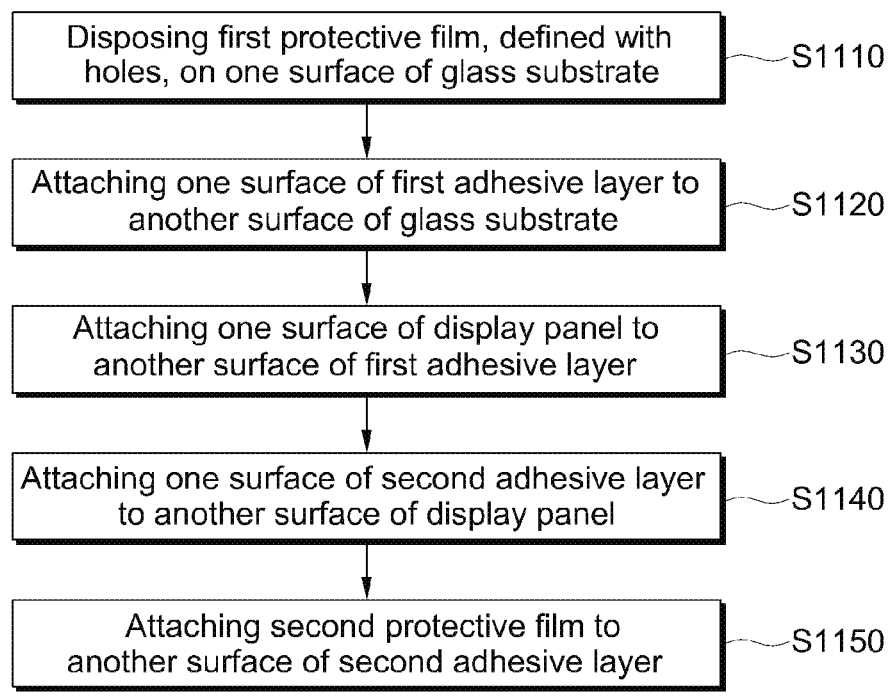
FIG. 11 is a flowchart illustrating a method of manufacturing a flexible display device according to an exemplary embodiment.

FIG. 11 is a flowchart illustrating a method of manufacturing a flexible display device according to an exemplary embodiment.

Referring to FIG. 11, a method of manufacturing a flexible display device according to an exemplary embodiment includes disposing the first protective film 120, which is defined with one or more vacuum holes 122, on one surface of the glass substrate 110 (S1110).

In such an exemplary embodiment, the anti-finger layer 150 is applied on said one surface of the glass substrate 110, and the first protective film 120 may be disposed on the anti-finger layer 150.

In describing an exemplary embodiment with reference to FIG. 11, the glass substrate 110 is described as the base substrate 110 by way of example. However, the base substrate 110 is not limited thereto. For example, in an exemplary embodiment according to FIG. 11, the base substrate 110 may be replaced with one of a PI substrate and a plastic substrate.

The first protective film 120 may have a release force greater than a release force of the second protective film 840 due to a vacuum suction force from the vacuum inlet 132 of the stage 130, to which the glass substrate 110 is adsorbed, through one or more vacuum holes 122. In such an exemplary embodiment, a release force of the second protective film 840 may be about equal to or greater than about 20 gf/inch.

The first protective film 120 may be a release film that temporarily protects the glass substrate 110 from contaminants such as, for example, dust, debris, and moisture. The release film may be a plastic film including at least one of, for example, polyimide (PI), polyethylene terephthalate (PET), polyethylene naphthalate (PEN), polyethersulfone (PES), nylon, polytetrafluoroethylene (PTFE), polyether ether ketone (PEEK), polycarbonate (PC), and/or polyarylate.

Next, one surface of the first adhesive layer 810 is laminated to another surface of the glass substrate 110 (S1120).

That is, the first protective film 120 is laminated to one surface of the glass substrate 110, and the first adhesive layer 810 is laminated to another surface of the glass substrate 110.

In such an exemplary embodiment, another surface of the first protective film 120 that is different from a surface of the first protective film 120 to which the glass substrate 110 is attached is disposed on the stage 130, and the first protective film 120 is adsorbed to the stage 130 together with the glass substrate 110 in accordance with vacuum suction from the stage 130. That is, the first protective film 120 is adsorbed to the stage 130 according to the vacuum suction force from the stage 130 through the vacuum inlet 132.

In addition, the glass substrate 110 is adsorbed to the stage 130 in accordance with the vacuum suction force from the vacuum inlet 132 of the stage 130 through the one or more vacuum holes 122 of the first protective film 120.

The glass substrate 110 may be adsorbed to the stage 130 in accordance with vacuum suction through the one or more vacuum holes 122 defined at an area of the first protective film 120 corresponding to the non-display area of the display panel 820. For example, in an exemplary embodiment in which the vacuum holes 122 are defined at an area of the first protective film 120 corresponding to the non-display area of the display panel 820, the glass substrate 110 may be adsorbed to the stage 130 in an area corresponding to the non-display area of the display panel 820.

The glass substrate 110 may be adsorbed to the stage 130 in accordance with vacuum suction through the one or more vacuum holes 122 defined at an area of the first protective film 120 corresponding to the display area of the display panel 820. For example, in an exemplary embodiment in which the vacuum holes 122 are defined at an area of the first protective film 120 corresponding to the display area of the display panel 820, the glass substrate 110 may be adsorbed to the stage 130 in an area corresponding to the display area of the display panel 820.

Thus, in an exemplary embodiment, the glass substrate 110 may be adsorbed to the stage 130 in accordance with vacuum suction through the one or more vacuum holes 122 defined at an area of the first protective film 120 corresponding to the display area and the non-display area of the display panel 820.

As such, in a state in which the glass substrate 110 is adsorbed to the stage 130, the first adhesive layer 810 is laminated to another surface of the glass substrate 110 (e.g., the surface opposite to the surface adsorbed to the stage 130).

The first adhesive layer 810 may be folded, rolled, or bended. Accordingly, when the flexible display device 800 is folded, rolled, or bended, the first adhesive layer 810 may also be folded, rolled, or bended together with the flexible display device 800 without being damaged.

The first adhesive layer 810 may include, for example, a pressure sensitive adhesive (PSA). For example, the first adhesive layer 810 may include an acryl-based material, a silicone-based material, and/or a urethane-based material.

Next, one surface of the display panel 820 is laminated to another surface of the first adhesive layer 810 (S1130).

For example, the glass substrate 110 is laminated to one surface of the first adhesive layer 810, and the display panel 820 is laminated to another surface of the first adhesive layer 810. An adhesive force between the display panel 820 and the first adhesive layer 810 may be in a range from about 0.3 kgf/inch to about 1.5 kgf/inch.

It is exemplified in an exemplary embodiment that the first protective film 120 is disposed on one side of the glass substrate 110 (S1110), and one surface of the first adhesive layer 810 is laminated to another surface of the glass substrate 110 (S1120). However, the present invention is not limited thereto. For example, in an exemplary embodiment, the first protective film 120 at which one or more vacuum holes 122 are defined may be disposed on the stage 130, the glass substrate 110 may be disposed on the first protective film 120, the first adhesive layer 810 may be disposed on the glass substrate 110, and the display panel 820 may be disposed on the first adhesive layer 810.

In such an exemplary embodiment, the display panel 820 is an element that displays images, the display panel 820 includes a plurality of signal lines and pixels connected thereto, and each pixel may be one of a red pixel R, a green pixel G and a blue pixel B.

The signal line includes, for example, a scanning signal line for transmitting a gate signal (or a scanning signal), a data line for transmitting a data signal, and a driving voltage line for transmitting a driving voltage. The scanning signal lines extend substantially in a row direction and are substantially parallel to each other, and the data lines extend substantially in a column direction and are substantially parallel to each other. The driving voltage line extends substantially in the column direction, but may extend in the row direction or the column direction or may be formed in a net shape.

One pixel PX includes a switching transistor, a driving transistor, a storage capacitor and an organic light emitting element. The switching transistor includes a control terminal, an input terminal, and an output terminal. The control terminal is connected to the scanning signal line, the input terminal is connected to the data line, and the output terminal is connected to the driving transistor. The switching transistor transmits the data signal received from the data line to the driving transistor in response to the scanning signal received from the scanning signal line. The driving transistor also includes a control terminal, an input terminal, and an output terminal. The control terminal is connected to the switching transistor, the input terminal is connected to the driving voltage line, and the output terminal is connected to the organic light emitting element. The driving transistor allows an output current whose magnitude varies depending on a voltage applied between the control terminal of the driving transistor and the output terminal of the driving transistor to flow. The capacitor is connected between the control terminal of the driving transistor and the input terminal of the driving transistor. This capacitor charges the data signal applied to the control terminal of the driving transistor, and holds the charge even after the switching transistor is turned off.

The organic light emitting element may be, for example, an organic light emitting diode (OLED). The organic light emitting element includes an anode connected to the output terminal of the driving transistor, and a cathode connected to a common voltage Vss. The organic light emitting element emits light with different intensities according to the output current of the driving transistor to display images. The organic light emitting element may include one or more organic materials, each intrinsically emitting light of one of primary colors (e.g., red, green and blue), and an organic light emitting display device including the organic light emitting element may display desired images by spatially combining such colors.

Referring again to FIG. 11, one surface of the second adhesive layer 830 is laminated to another surface of the display panel 820 (S1140).

For example, the glass substrate 110 is laminated to the one surface of the display panel 820 through the first adhesive layer 810, and the second adhesive layer 830 is disposed on another surface of the display panel 820.

In such an exemplary embodiment, the second adhesive layer 830 may be folded, rolled, or bended in a substantially same manner as the first adhesive layer 810. Accordingly, when the flexible display device 800 is folded, rolled, or bended, the second adhesive layer 830 may also be folded, rolled, or bended together with the flexible display device 800 without being damaged. The second adhesive layer 830 may include, for example, a pressure sensitive adhesive (PSA). For example, the second adhesive layer 830 may include an acryl-based material, a silicone-based material, and/or a urethane-based material.

Next, the second protective film 840 is laminated to another surface of the second adhesive layer 830 (S1150).

For example, the display panel 820 is laminated to one surface of the second adhesive layer 830, and the second protective film 840 is laminated to another surface of the second adhesive layer 830.

In such an exemplary embodiment, the first protective film 120 may have a release force greater than a release force of the second protective film 840 as a result of a vacuum suction force from the stage 130 through the vacuum inlet 132.

In such an exemplary embodiment, the second protective film 840 may be a release film that protects the display panel 820 from contaminants such as, for example, dust, debris, and moisture. The release film may be, for example, a plastic film including, for example, polyimide (PI), polyethylene terephthalate (PET), polyethylene naphthalate (PEN), polyethersulfone (PES), nylon, polytetrafluoroethylene (PTFE), polyether ether ketone (PEEK), polycarbonate (PC), and/or polyarylate. An adhesive force between the second protective film 840 and the second adhesive layer 830 may be in a range from about 0.3 kgf/inch to about 1.5 kgf/inch.

The first protective film 120 may have a release force with respect to the glass substrate 110, which is substantially equal to or greater than about 20 gf/inch due to a vacuum suction force from the stage 130 through the vacuum inlet 132 and the vacuum hole 122. One or more vacuum holes 122 of the first protective film 120, each having a diameter less than a diameter of the vacuum inlet 132 formed in the stage, may be dispersed substantially equally at the first protective film 120.

Figure 12:
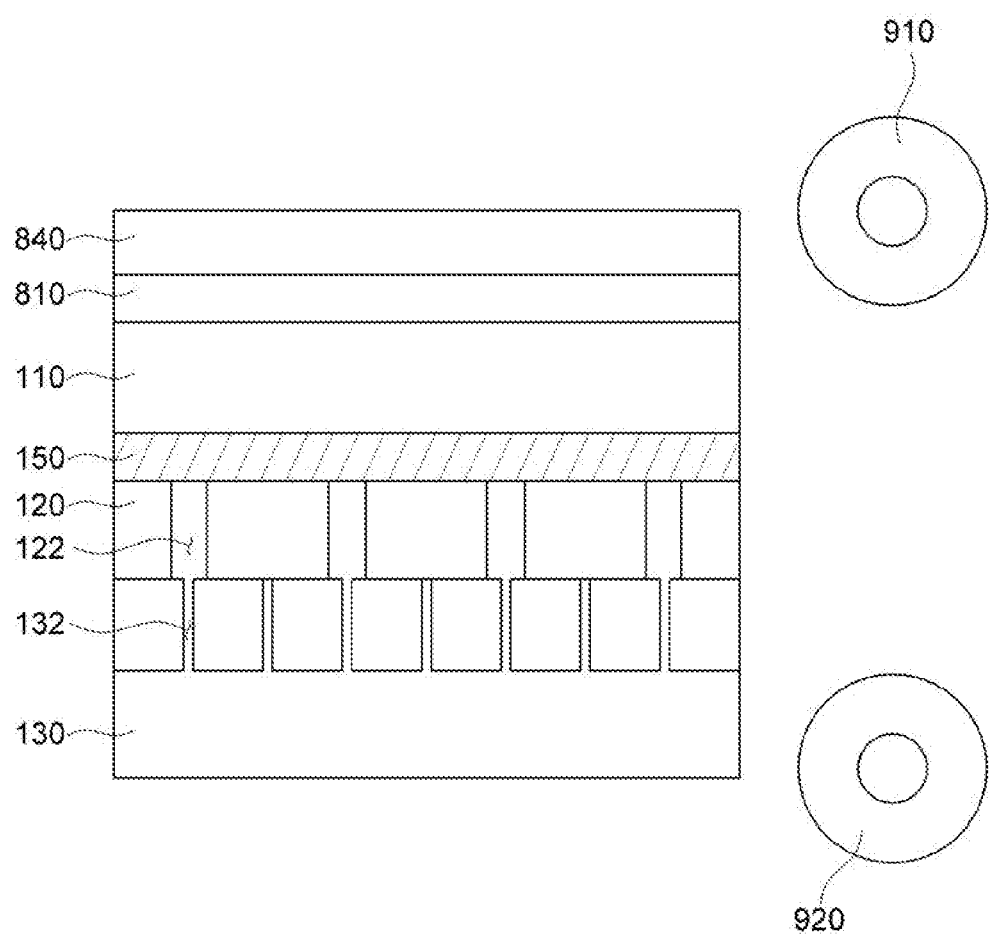
FIG. 12 is a view illustrating a lamination process for laminating a protective film to a glass substrate according to an exemplary embodiment.

FIG. 12 is a view illustrating a lamination process for laminating a protective film to a glass substrate according to an exemplary embodiment.

Referring to FIG. 12, to manufacture the flexible display device 800 according to an exemplary embodiment, a lamination process may be performed in which the first protective film 120 is laminated on the anti-finger layer 150 in a state in which the anti-finger layer 150 is attached to the glass substrate 110, and the second protective film 840 is laminated to another surface of the glass substrate 110 through the first adhesive layer 810. As illustrated in FIG. 12, in a case in which the first protective film 120 is laminated on the anti-finger layer 150 to which the glass substrate 110 is attached, and in which the second protective film 840 is laminated to another surface of the glass substrate 110, delamination between the anti-finger layer 150 and the first protective film 120 may be substantially prevented by maintaining an adsorption state between the anti-finger layer 150 and the first protective film 120. Such an adsorption state may be maintained by using a vacuum suction force through the plurality of vacuum holes 122 defined at the first protective film 120 while the window substrate 100 is inserted between lamination rollers 910 and 920.

In addition, according to exemplary embodiments, in a case in which the second protective film 840 laminated to the glass substrate 110 through the first adhesive layer 810 is separated from the first adhesive layer 810, the adsorption state of the anti-finger layer 150 and the first protective film 120 may be maintained by the vacuum suction force through the plurality of vacuum holes 122 defined in the first protective film 120. For example, when the stage 130 adsorbs the first protective film 120 through the vacuum inlet 132, since the vacuum hole 122 of the plurality of vacuum holes 122 of the first protective film 120 that overlaps the vacuum inlet 132 is disposed in correspondence with the vacuum inlet 132, the glass substrate 110 of the anti-finger layer 150 is also adsorbed to the stage 130 through the vacuum hole 122 that is disposed in correspondence with the vacuum inlet 132. Thus, an adsorption state of the anti-finger layer 150 and the first protective film 120 may be maintained.

Accordingly, even when the second protective film 840 is separated from the window substrate 100, delamination between the anti-finger layer 150 and the first protective film 120 included in the window substrate 100 may be substantially prevented, according to exemplary embodiments.

As such, according to one or more exemplary embodiments of the present invention, a window substrate that may substantially prevent delamination between an anti-finger layer and a protective film by using one or more vacuum holes defined in a protective film of a window in a manufacturing process, a flexible display device including the window substrate, and a method of manufacturing the flexible display device, may be provided.

As set forth hereinabove, according to one or more exemplary embodiments of the present invention, a flexible display device may substantially prevent delamination between the window and the protective film during the manufacturing process by maintaining the lamination state between the window and the protective film using the vacuum hole defined in the protective film.

Further, according to one or more exemplary embodiments of the present invention, the flexible display device may efficiently remove bubbles generated between the window and the protective film during the manufacturing process using a plurality of vacuum holes defined in the protective film.

Further, according to one or more exemplary embodiments of the present invention, the flexible display device may locally adsorb the window substrate in a vacuum manner during the manufacturing process, thus, stably securing the product until the manufacturing process is completed.

Further, according to one or more exemplary embodiments of the present invention, the quality of the flexible display device may be improved since pre-delamination of the protective film from the window substrate may be substantially prevented during the process of manufacturing the flexible display device, and the alignment stability of each member may be enhanced during the lamination process.

Further, according to one or more exemplary embodiments of the present invention, the manufacturing cost may be decreased by reducing defects of a high-cost window material used for manufacturing the flexible display device.

In addition, according to one or more exemplary embodiments of the present invention, the structural limit of a release force of the release film of the window substrate may be addressed by using a vacuum adsorption technique in the lamination process.

While the present invention has been illustrated and described with reference to the exemplary embodiments thereof, it will be apparent to those of ordinary skill in the art that various changes in form and detail may be made therein without departing from the spirit and scope of the present invention as defined by the following claims.

What is claimed is:

1. A flexible display device, comprising:
a window with a window substrate,
the window substrate comprising:
a base substrate;
a first protective film disposed on one side of the base substrate and having one or more vacuum holes; and
a display panel disposed on another side of the base substrate, wherein the display panel comprises a plurality of pixels and a plurality of signal lines connected to the plurality of pixels.

2. The flexible display device of claim 1, wherein one of the one or more vacuum holes overlaps a vacuum inlet formed in a stage on which the base substrate is disposed during a manufacturing process.

3. The flexible display device of claim 2, wherein the one of the one or more vacuum holes has a size larger than a size of the vacuum inlet of the stage.

4. The flexible display device of claim 1, wherein the one or more vacuum holes has a shape of a circle, a polygon, or a combination thereof.

5. The flexible display device of claim 1, further comprising: an adhesive layer disposed between the one surface of the base substrate and the first protective film.

6. The flexible display device of claim 1, further comprising: an anti-finger layer disposed on the one surface of the base substrate, wherein the first protective film is disposed on the anti-finger layer.

7. The flexible display device of claim 1, wherein the one or more vacuum holes are defined in the first protective film at substantially regular intervals.

8. The flexible display device of claim 1, wherein the one or more vacuum holes are uniformly distributed in the first protective film, and each vacuum hole has a predetermined size.

9. The flexible display device of claim 1, wherein the one or more vacuum holes are arranged at substantially regular intervals along an edge of the base substrate in a plan view.

10. The flexible display device of claim 1, wherein the base substrate is one of a glass substrate, a polyimide (PI) substrate, and a plastic substrate.

11. A The flexible display device of claim 1, further comprising:
   a first adhesive layer disposed between the base substrate and the display panel;
   a second adhesive layer disposed on the display panel; and
   a second protective film disposed on the second adhesive layer.

12. The flexible display device of claim 11, wherein the one or more vacuum holes are defined in an area of the first protective film corresponding to a non-display area of the display panel.

13. The flexible display device of claim 11, wherein the one or more vacuum holes are uniformly distributed in the first protective film, and each vacuum hole has a diameter less than a diameter of a vacuum inlet formed in a stage on which the base substrate is disposed during a manufacturing process.

14. The flexible display device of claim 13, wherein the first protective film has a release force with respect to the base substrate, which is about equal to or greater than about 20 gf/inch by a suction force from the vacuum inlet through the one or more vacuum holes.

15. The flexible display device of claim 11, wherein the base substrate has a release force greater than a release force of the first adhesive layer due to the one or more vacuum holes of the first protective film.

16. The flexible display device of claim 11, wherein the vacuum holes are dispersed over an area of the first protective film corresponding to a display area and a non-display area of the display panel.

* * * * *